United States Patent [19]
Nemoz

[11] Patent Number: 5,396,401
[45] Date of Patent: Mar. 7, 1995

[54] MODULAR PRINTED CIRCUIT BOARD HOLDER STRUCTURE, CAPABLE OF ENGAGING, IN DRAWER-LIKE FASHION, IN A RACK OF AN ELECTRONIC INSTALLATION

[75] Inventor: Gérard Nemoz, Maisons Alfort, France

[73] Assignee: Sextant Avionique, Meudon la Foret, France

[21] Appl. No.: 87,407

[22] Filed: Jul. 8, 1993

[30] Foreign Application Priority Data

Jul. 8, 1992 [FR] France ................... 92 08436

[51] Int. Cl.⁶ ............................................. H05K 7/20
[52] U.S. Cl. ..................... 361/690; 361/704; 361/730; 361/747; 361/754; 361/759
[58] Field of Search ............... 174/35 R; 361/687–688, 361/690, 694–697, 702, 711, 715–716, 719–720, 724–733, 736–741, 744, 747–748, 752–754, 756, 758–759, 785, 790, 795–796, 798, 800–804, 807–809, 816, 818, 829, 831

[56] References Cited

U.S. PATENT DOCUMENTS

| | | | |
|---|---|---|---|
| 3,141,998 | 7/1964 | Silkman | 361/716 |
| 3,951,490 | 4/1976 | Devendorf | 361/736 |
| 4,313,150 | 1/1982 | Chu | 361/801 |
| 4,388,672 | 5/1983 | Skill | 361/739 |
| 4,716,499 | 12/1987 | Bhargava | 361/740 |
| 4,899,254 | 2/1990 | Ferchan et al. | 361/695 |
| 4,916,575 | 4/1990 | Van Asten | 361/736 |
| 4,931,909 | 6/1990 | Backes | |
| 5,038,250 | 8/1991 | Uenaka et al. | 361/730 |

FOREIGN PATENT DOCUMENTS

| | | | |
|---|---|---|---|
| 2534109 | 4/1984 | France | |
| 117399 | 5/1987 | Japan | |
| 1324560 | 7/1973 | United Kingdom | 174/35 R |
| WO8808662 | 11/1988 | WIPO | |

OTHER PUBLICATIONS

IBM, "Method For Increasing Volume of Logic Books":, IBM Technical Disclosure Bulletin; vol. 33, No. 6A, Nov. 1990: New York, pp. 441–443.

Primary Examiner—Gregory D. Thompson
Attorney, Agent, or Firm—Browdy and Neimark

[57] ABSTRACT

The modular structure embodying the invention comprises at least one frame, preferably manufactured in molded material, on which a printed circuit board is attached and whose rear vertical member has at least one indentation in which a group of connection elements is engaged, the frame comprising two lateral flanks equipped with attachment means to each of which can be attached either a covering plate or a second frame identical to the first one. The invention notably enables the connections between the printed circuit boards and the output connector of the structure to be reduced to a single level.

10 Claims, 4 Drawing Sheets

MODULAR PRINTED CIRCUIT BOARD HOLDER STRUCTURE, CAPABLE OF ENGAGING, IN DRAWER-LIKE FASHION, IN A RACK OF AN ELECTRONIC INSTALLATION

BACKGROUND OF THE INVENTION

1. Field of the Invention

This invention relates to a modular printed circuit board holder structure, capable of engaging, in drawer-like fashion, in a rack of an electronic installation, and of connecting by means of integrated connecting means to interconnection elements provided at the back of the rack (backpanel interconnections).

It applies notably, though not exclusively, to the electronic connections situated on board an aerodyne.

2. Description of the Prior Art

In a general manner, it is known that the structures of this type currently used are in the form of cases housing the printed circuit boards and whose entire rear side supports mechanical and electrical connection elements adapted to those of both the rack and the printed circuit boards.

However, this solution has a certain number of drawbacks.

It firstly implies plural levels of connection between the printed circuit board and the connectors attached to the rear side of the rack. These connectors each comprise a generally parallelepiped body fitted with attachment means and housing a plurality of connection elements mounted in one or more insulating blocks; each of these elements comprises an external part shaped so as to cooperate with corresponding connection elements provided at the back of the rack, and an internal part connected to the electronic circuit of the board, usually by means of a connector header.

Furthermore, this solution is relatively heavy, costly to manufacture and is thermally not very satisfactory. It is not well suited to the heat exchanges necessary for the evacuation of the heat calories generated by the electronic components borne by the printed circuit board.

Finally, it is a relatively set and not very associative structure which therefore has only limited possibilities notably as regards the location and dimensions of the components it is intended to receive.

OBJECT OF THE INVENTION

The main object of this invention is therefore to remedy the preceding drawbacks, particularly to provide a relatively simple modular structure both in terms of its design and implementation, and which notably enables:

- the manufacture of cases or drawers of variable thickness, capable of containing one or more directly connectable printed circuit boards;
- the efficient holding up and stiffening of the printed circuit boards;
- the integration of the connection element blocks to the structure without having to use the other elements of conventional connectors (notably their mechanical part);
- the reduction, to a single level, of the connections between the boards of the printed circuit and the output connector of the modular structure;
- the establishing of direct thermal conduction bridges between the printed circuit elements, which are subjected to heat emission, and heat conductive external walls acting as heat sinks;
- the integration of case positioning, polarizing and locking means.

SUMMARY OF THE INVENTION

In order to achieve these results, the structure embodying the invention comprises at least one frame, preferably manufactured in molded material, delimiting at least one parallelepiped-shaped flat volume whose inner contour edge, which is at least partially crimped, has rabbet elements to which can be attached a printed circuit board contained in said volume, said frame comprising a front vertical member shaped so as to have a least one indentation in which is engaged and attached a set of connection elements whose inner parts are directly connected, by means of conductive links, to conductive areas of the printed circuit, said frame further comprising two lateral flanks equipped with attachment means to each of which can be attached either a covering plate, preferably in a good heat conducting material, or a second frame identical to the first one.

Advantageously, said front vertical member of the frame can comprise, on its outer side, polarizing means capable of cooperating with corresponding means provided in the back of the rack, to prevent all possibility of connection error.

Furthermore, the rear vertical member of the frame can be shaped so as to receive a locking mechanism enabling the structure to be locked into its engaged position connected to the rack.

BRIEF DESCRIPTION OF THE DRAWINGS

Further features and advantages of the invention will be apparent from the following particular description of a preferred embodiment of this invention, by way of a non-limiting example, in reference to the accompanying drawings in which:

FIG. 4 is a perspective view of a modular structure in the assembled state which comprises at least two of the frames illustrated in FIGS. 1 to 3.

DESCRIPTION OF THE PREFERRED EMBODIMENTS

Figure 1:
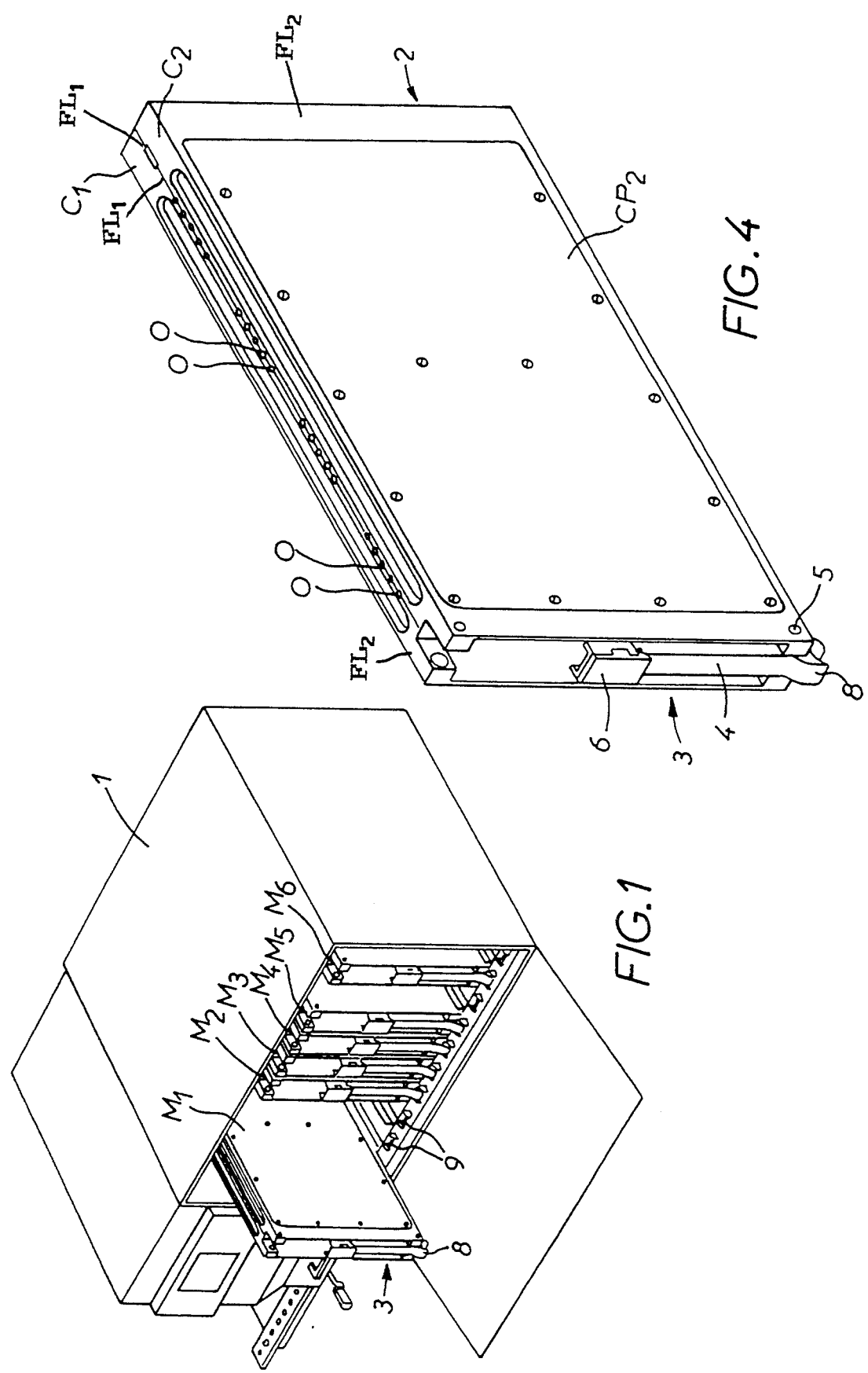
FIG. 1 is a perspective view showing a rack inside which are disposed modular board holder structures embodying the invention.

As represented in FIG. 1, the modular structures $M_1$ to $M_6$, one of which, $M_1$, is partially engaged in the rack of an electronic device, are of flat, substantially parallelepiped shape of which the rear side (visible in FIGS. 2 and 3) is fitted with three connection groups $E_1$, $E_2$, $E_3$ destined to cooperate with corresponding connectors placed at the back of the rack 1 (backpanel connectors). The set of three connection groups $E_1$, $E_2$, $E_3$ forms the equivalent of a usual connector.

The front side 3 of each of these modular structures is fitted with one (or two) locking device(s) using a tilting lever 4, mounted pivotably about an axis 5 situated close to the lower side and whose upper part bears an oscillating locking part 6 of which a sliding bolt-shaped part engages into a conformation serving as strike plate G, provided on the front side 3.

The lower end of the lever 4 is in the shape of a fork 8 and is itself intended to engage in a clamp 9 mounted slidably on the lower side of the rack 1 and pulled back by a spring (not represented) towards the inside of the rack, so as to have the modular structure permanently pressed against the back of the rack.

Figure 6:
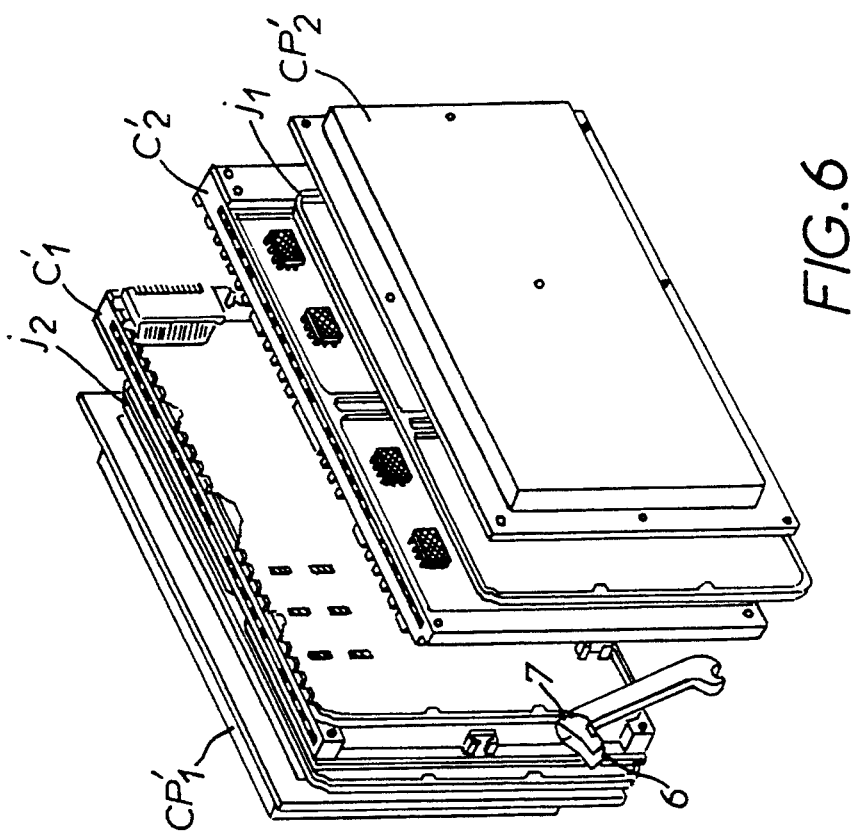
FIGS. 5, 6 and 7 are exploded perspective views illustrating three further embodiments of a modular structure embodying the invention.
Figure 5:
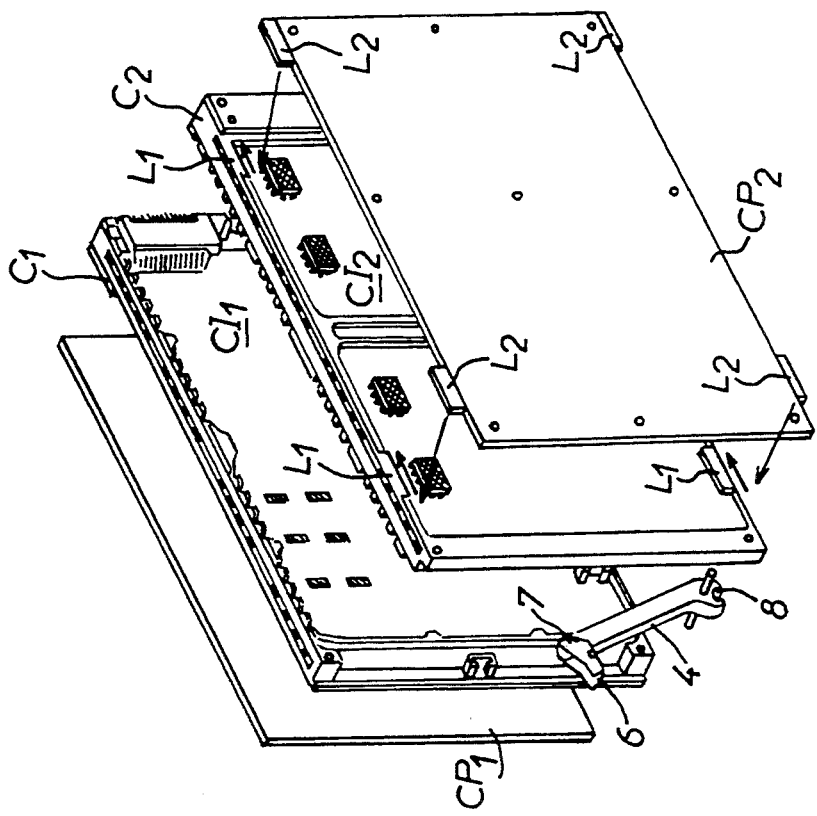

This locking mechanism then operates as follows:

When engaging the structure $M_1$ into the rack 1, the locking part 6 is in the unlocked state and the lever 4 is tilted slightly backwards in the position indicated in FIGS. 5 and 6.

At the end of the engaging stroke, the fork 8 of the lever 4 embraces the transversal bar of the clamp 9 while the connectors of groups $E_1$, $E_2$, $E_3$ of the modular structure $M_1$ engage into the connectors of the rack 1.

The locking $M_1$ of the structure is then obtained by lowering the lever 4 against the front side, until the sliding bolt 7 of the locking part 6 engages with the strike plate G, thereby ensuring the lever 4 is locked.

During tilting of the lever 4, the fork 8 exerts a pull on the clamp 9 against the action of the spring so that, in the locked position the structure $M_1$ is subjected to a force orientated towards the back of the rack 1, which thus ensures the quality of the contacts.

In accordance with the invention, each modular structure $M_1$ to $M_6$ comprises at least one frame C of substantially rectangular shape, preferably in a molded material, e.g. in a composite material or a light metal such as aluminium.

The inner edge of this frame C is at least partially crimped so as to obtain rabbets $F_1$, $F_2$ onto which is attached a printed circuit CI board completely housed in the interior volume delimited by the frame C.

In this example, the frame C comprises a crosspiece 11 which extends in its medial part, parallel to its rear and front vertical members 12, 13, this crosspiece being intended to ensure the holding up and stiffening of the printed circuit board CI.

The front vertical member 13 of the frame C has an L-shaped outer rabbet FE with, in its medial part, a conformation forming a half strike plate G' and comprising, at its ends, two transversal bores 15, 16, drilled in the wing of the rabbet FE longitudinally prolonging the frame C, one of which is intended to receive the pivoting axis of lever 4, and the other one a second temporary lever.

The rear vertical member 12 comprises, in this instance, three identical indentations 17, 18, 19 of substantially parallelepiped shape which open at the level of its outer edge 20.

These three indentations 17, 18, 19 are intended to receive the three connection groups $E_1$, $E_2$, $E_3$ of corresponding shape each comprising a plurality of connection elements angled parallel to the longitudinal axis of the frame C and made interdependent with one another along their central part by means of a casing 21 in an electrically insulating plastic material.

The rear vertical member further comprises foolproof means DT (FIG. 3) capable of cooperating with corresponding means provided on the back of the rack.

The general conformation of the frame C is designed in such a way that two identical frames can be assembled together so that the indentations 17, 18, 19 of the rear vertical members 12 coincide, that the L-shaped rabbets of the front vertical members delimit a groove in which the lever 4 is partially housed, and that the bores 15, 16 are coaxial two by two so as to be able to receive the axis of the lever 4. Once assembled, the two frames can be fastened together by screws. However, when the frames are fitted with slide rails enabling them to be completely or partially assembled by sliding, this fastening by screws can be avoided.

Furthermore, each of the frames C is fitted with bores 22 enabling the fastening by screwing of the frames therebetween, as well as of caps that can consist in flat plates $CP_1$, $CP_2$ whose contour substantially corresponds to that of the lateral faces $FL_1$, $FL_2$ of the frame C to which it is fastened.

Figures 2, 3:
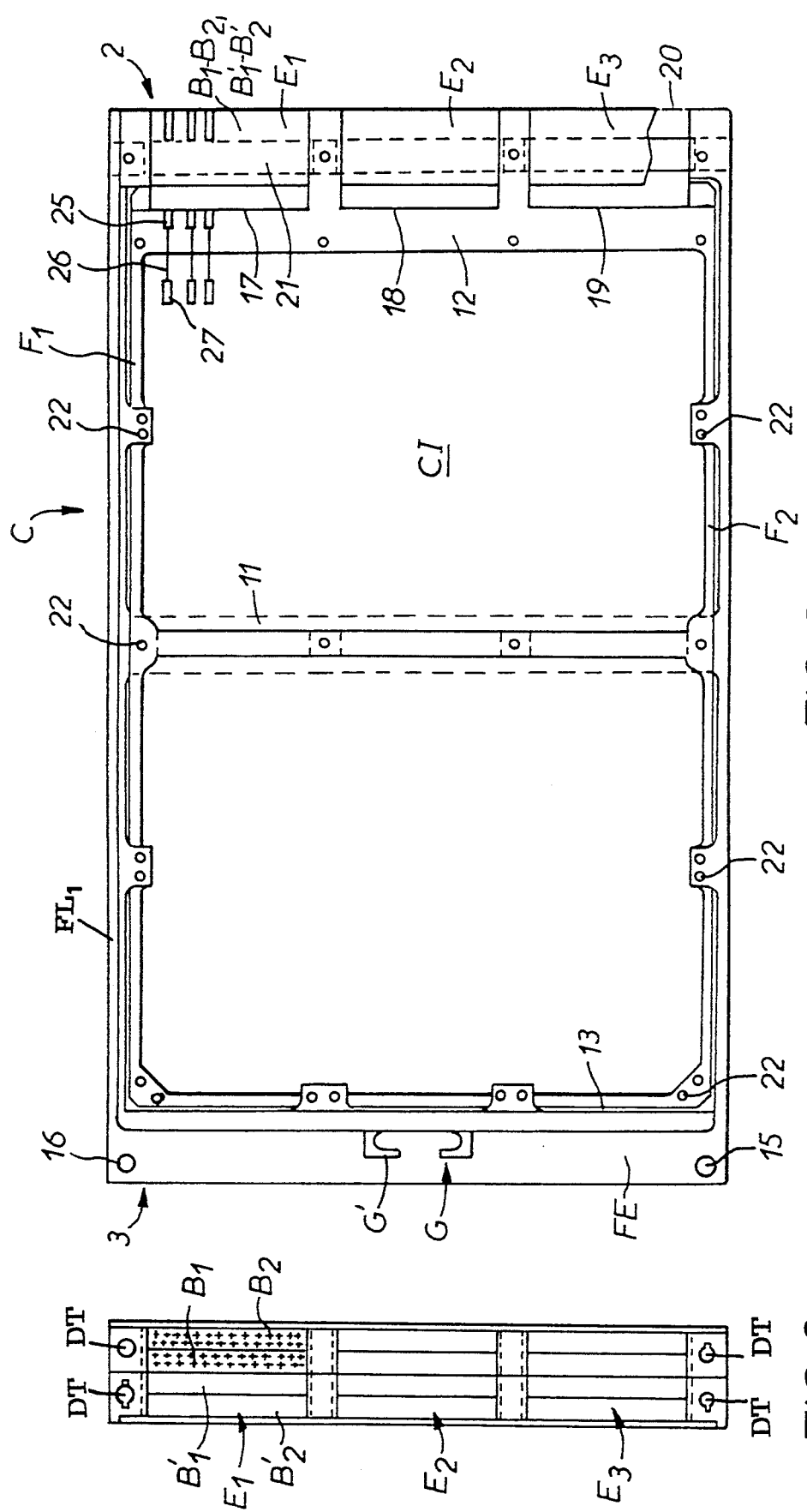
FIG. 2 is a side view of a frame used in each of the modular structures.
FIG. 3 is an elevational view of the front side of the frame, fitted with connection blocks.

In the embodiment of FIG. 2, the bores 22 are provided in protrusions formed in the rabbets $F_1$, $F_2$, and the electronic circuit board CI comprises lateral notches through which the said portions pass when the board CI is assembled on the rabbets $F_1$, $F_2$.

The invention is not, of course, limited to this mode of attachment.

The frame could thus comprise two longitudinal sliding rails in which said cap can engage by sliding. In this case, the locking can be obtained by screwing at a single point.

Likewise, the longitudinal edges of the frame could comprise tongues $L_1$ intended to cooperate with corresponding tongues $L_2$ provided on the longitudinal edges of the cap $CP_2$, the locking of cap $CP_2$ being then obtained after a partial relative sliding enabling the tongues $L_2$ of the cap $CP_2$ to be engaged under the tongues $L_1$ of the frame $C_2$.

These caps $CP'_1$, $CP'_2$ may have a bulged shape in order to increase the interior volume of the modular structure and to thus enable the utilisation of bulkier electronic components or the addition of another printed circuit directly connected to the first one (mechanically and/or electrically).

In the examples represented in FIGS. 5 and 6, the outer sides of the upper and lower vertical members each have a longitudinal groove, while the inner edges of these vertical members are fitted with semicylindrical notches which, once the two frames have been assembled together, delimit the transversal orifices O intended to ventilate the interior volume of the modular structure.

Advantageously, the caps $CP_1$, $CP_2$–$CP'_1$, $CP'_2$ can be manufactured in a good heat conducting material in order to be able to serve as heat sinks.

In this case, the components subjected to high heat dissipation are arranged in thermal contact with caps $CP_1$, $CP_2$–$CP'_1$, $CP'_2$, either directly or through the intermediary of elements serving as thermal conduction bridges.

These arrangements thus enable the heat dissipation problems to be solved particularly efficiently by both conduction on elements having large heat dissipation areas and by internal ventilation of the entire structure and of the electronic circuits it contains.

The connection packages $E_1$, $E_2$, $E_3$ engaging in the indentations 17, 18, 19 are of substantially rectangular parallelepiped general shape, and can be manufactured in two blocks $B_1$, $B_2$–$B'_1$, $B'_2$ to be assembled together at the level of the junction plane parallel to the plane of the printed circuit CI board.

In the example in FIG. 2, each block is associated with a corresponding side of the printed circuit board and comprises two rows of connectors whose internal ends 25 are prolonged by elastic tongues 26 resting by their ends against conductive areas 27 provided on the printed circuit.

Advantageously, the connection blocks $B_1$, $B_2$–$B'_1$, $B'_2$ are maintained within the indentations 17, 18, 19 by conformations of shape complementary to said indentations and said blocks axially blocking the latter, and by the caps $CP_1$, $CP_2$–$CP'_1$, $CP'_2$, (or by parts serving as caps) covering the indentations 17, 18, 19.

Such an assembly avoids having to use complete connector structures as available in the trade and as equipping racks up to now.

By way of its design, the modular structure previously described is of variable composition.

It can comprise two frames $C_1$, $C_2$ assembled together and each bearing a printed circuit board $CI_1$, $CI_2$ and two flat caps $CP_1$, $CP_2$ as represented in FIG. 5.

The printed circuits $CI_1$, $CI_2$ borne by these two frames $C_1$, $C_2$ can advantageously be directly interconnected (e.g. by means of plug-in connectors), so as to reduce the number of connections between each of the boards $CI_1$, $CI_2$ and the backpanel connectors of the rack 1.

This structure could comprise two frames $C'_1$, $C'_2$ similar to those in FIGS. 1 to 5 but fitted with bulged caps $CP'_1$, $CP'_2$ connected to the frames $C'_1$, $C'_2$ by means of a peripheral seal $j_1$, $j_2$ acting as spacer (thickness to be determined as a function of requirements).

A further advantage of the structures previously described consists in that one of the printed circuit boards can comprise recesses enabling components borne by the other printed circuit board to pass.

Figure 7:
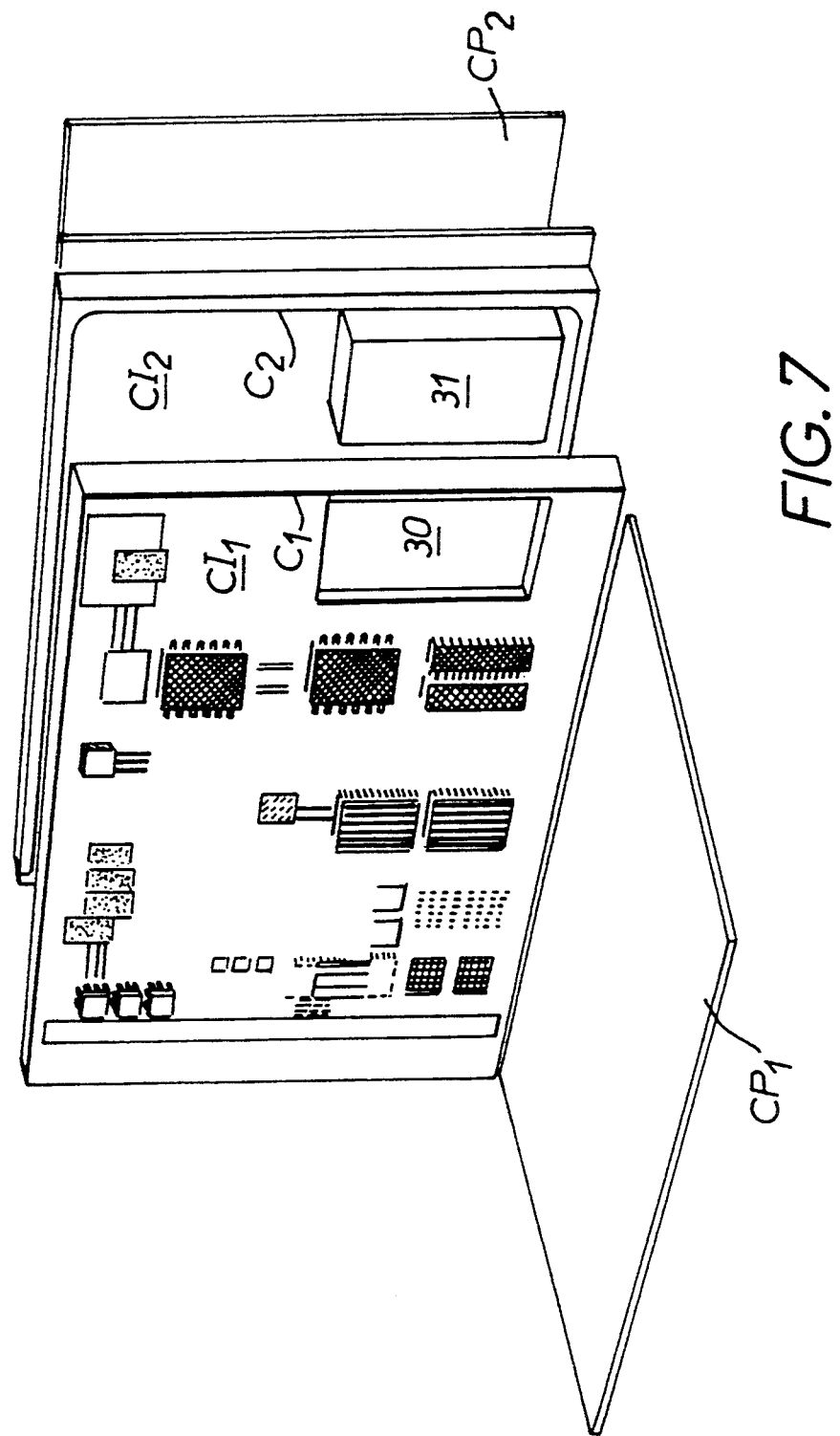

This feature is illustrated in FIG. 7 in which the printed circuit $CI_1$ comprises a rectangular recess 30 through which the case 31 of a voluminous electronic component borne by the other printed circuit $CI_2$ can pass.

The maximum number of frames used in a same structure is not of course limited to two: this number can vary as a function of the requirements and design of the rack 1.

I claim:

1. A modular printed circuit board holder structure adapted to be engaged, in drawer-like fashion, in a rack of an electronic installation having a back provided with interconnection elements, said structure comprising a first and a second identical frame each having an inner contour edge which delimits a flat volume, said edge being provided with rabbets onto which a printed circuit board can be attached so as to be contained in said volume, upper and lower horizontal members, a rear vertical member provided with at least one notch in which is engaged a removable connection group comprising a plurality of connection elements, directly connected by means of conductive links to conductive areas of the printed circuit board, a front vertical member having a L-shaped outer rabbet, and two opposite lateral sides equipped with fixing means, one of said lateral sides belonging to said first frame being assembled and fixed against a lateral side of said second frame through said fixing means, the notches of said first frame and said second frame being in coincidence and each L-shaped outer rabbet delimiting therebetween a groove which houses at least partially a locking mechanism enabling said structure to be locked in said rack in an engaged position.

2. The structure as claimed in claim 1, wherein said rear vertical member of said first frame and said second frame comprises foolproof connection means for cooperating with corresponding connection means provided in the back of said rack, to prevent possibility of connection error.

3. The structure as claimed in claim 1, wherein said locking mechanism comprises a tilting lever mounted pivotably about an axis situated close to the lower horizontal member of said first frame and said second frame and having an upper part which bears an oscillating locking part which engages into a conformation on a strike plate provided on the front vertical member of said first frame and said second frame, the lever having a fork-shaped end engaging in a clamp provided on said rack in said engaged position.

4. The structure as claimed in claim 3, wherein the L-shaped outer rabbet has a medial part which is shaped so as to form a part of said conformation.

5. The structure as claimed in claim 1, wherein said first frame and said second frame comprises a crosspiece having a medial part, which extends parallel to the front and rear vertical members, said crosspiece being intended to hold up and to stiffen the printed circuit board.

6. The structure as claimed in claim 1, wherein said upper and lower horizontal members of said first frame and said second frame comprise orifices serving to ventilate said modular structure.

7. The structure as claimed in claim 1, which further comprises a flat or bulged covering plate.

8. The structure as claimed in claim 1, which further comprises a covering plate fixed on one lateral face, said covering plate adapted to be thermally connected to components of the printed circuit board.

9. The structure as claimed in claim 1, wherein said connection group is substantially parallelepiped-shaped, and comprises two blocks assembled one another at the level of a junction plane parallel to the printed circuit board.

10. The structure as claimed in claim 9, wherein each connection group has at least one row of connectors having internal ends which are prolonged by elastic tongues having end which bear against conductive areas provided on the printed circuit.

* * * * *